United States Patent
Okabe et al.

(10) Patent No.: US 7,515,879 B2
(45) Date of Patent: Apr. 7, 2009

(54) RADIO FREQUENCY CIRCUIT MODULE

(75) Inventors: Hiroshi Okabe, Tokyo (JP); Hidetoshi Matsumoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 337 days.

(21) Appl. No.: 11/013,337

(22) Filed: Dec. 17, 2004

(65) Prior Publication Data

US 2005/0176380 A1  Aug. 11, 2005

(30) Foreign Application Priority Data

Feb. 5, 2004  (JP)  ............... 2004-029111

(51) Int. Cl.
*H04B 1/38* (2006.01)
(52) U.S. Cl. .............. 455/73; 455/91; 455/85; 455/115.1; 455/117; 455/253.2; 455/330; 455/69; 455/293; 455/144; 455/226.1; 455/127.3; 455/333; 455/341; 455/311; 370/276; 370/281
(58) Field of Classification Search ............... 455/91, 455/73, 85, 115.1, 117, 333, 330, 69, 293, 455/309, 144, 226.1, 127.3, 341, 311, 253.2; 370/276, 281
See application file for complete search history.

(56) References Cited

U.S. PATENT DOCUMENTS

| | | | | |
|---|---|---|---|---|
| 5,172,074 | A * | 12/1992 | Shiga | 330/277 |
| 6,081,157 | A * | 6/2000 | Ikeda et al. | 330/107 |
| 6,232,645 | B1 * | 5/2001 | Belot | 257/516 |
| 6,377,464 | B1 * | 4/2002 | Hashemi et al. | 361/760 |
| 6,407,449 | B1 * | 6/2002 | Takikawa et al. | 257/690 |
| 6,410,858 | B1 * | 6/2002 | Sasaki et al. | 174/255 |
| 6,624,509 | B2 * | 9/2003 | Takikawa et al. | 257/692 |
| 6,639,310 | B2 * | 10/2003 | Takikawa et al. | 257/690 |
| 6,735,087 | B2 * | 5/2004 | Inoue et al. | 361/736 |
| 6,757,178 | B2 | 6/2004 | Okabe et al. | 361/793 |
| 6,766,149 | B1 * | 7/2004 | Hikita et al. | 455/83 |
| 6,839,241 | B2 * | 1/2005 | Benisek et al. | 361/760 |
| 6,856,007 | B2 * | 2/2005 | Warner | 257/678 |
| 7,071,545 | B1 * | 7/2006 | Patel et al. | 257/686 |
| 7,136,274 | B2 * | 11/2006 | Hwang et al. | 361/306.3 |
| 7,138,884 | B2 * | 11/2006 | Cheung et al. | 333/26 |
| 7,145,084 | B1 * | 12/2006 | Sarihan et al. | 174/361 |

(Continued)

FOREIGN PATENT DOCUMENTS

JP  2001-284984  10/2001

(Continued)

*Primary Examiner*—Duc Nguyen
*Assistant Examiner*—Amar Daglawi
(74) *Attorney, Agent, or Firm*—Miles & Stockbridge P.C.

(57) ABSTRACT

An RF circuit module, in which a power amplifier and a transceiver are united, with reduced interference between its electronic circuit blocks, downsized and still having high performance, and with a stable performance not dependent on the ground land structure on the motherboard, is provided. The ground plane 110 for at least a last-stage amplifier 11 of the power amplifier 10 where the greatest power is generated in the whole RF circuit block, that is, the source of generating the greatest noise and heat for the RF circuit block, is isolated from the ground plane for at least one circuit portion of the transceiver 9 including an LNA 51, receiver 52, transmitter 30, and VCO 70. These ground planes are connected to a common ground plane 480 through different connection conductors, respectively.

5 Claims, 10 Drawing Sheets

U.S. PATENT DOCUMENTS

| | | |
|---|---|---|
| 7,164,192 B2 * | 1/2007 | Petty-Weeks et al. ....... 257/667 |
| 7,176,506 B2 * | 2/2007 | Beroz et al. ................. 257/232 |
| 7,190,592 B2 * | 3/2007 | Hu .............................. 361/763 |
| 7,274,410 B2 * | 9/2007 | Birleson et al. ............. 348/731 |
| 2003/0090882 A1 * | 5/2003 | Song .......................... 361/761 |
| 2003/0097750 A1 | 5/2003 | Okabe et al. ................. 29/847 |
| 2003/0128522 A1 * | 7/2003 | Takeda et al. ............... 361/715 |
| 2004/0090266 A1 * | 5/2004 | Sakai et al. ................. 330/129 |
| 2004/0145417 A1 * | 7/2004 | Matsumoto et al. ......... 330/295 |
| 2005/0003789 A1 * | 1/2005 | Busch et al. ................ 455/300 |
| 2005/0041397 A1 * | 2/2005 | Alford et al. ................ 361/720 |
| 2005/0077964 A1 * | 4/2005 | Maeda ....................... 330/285 |
| 2005/0101282 A1 * | 5/2005 | Takikawa et al. ............ 455/333 |
| 2006/0252402 A1 * | 11/2006 | Khorram .................... 455/333 |

FOREIGN PATENT DOCUMENTS

| | | |
|---|---|---|
| JP | 2002-252297 | 9/2002 |
| JP | 2002-536819 | 10/2002 |
| JP | 2003-100989 | 4/2003 |
| JP | 2003-158378 | 5/2003 |
| JP | 2003-204013 | 7/2003 |
| JP | 2004-047866 | 2/2004 |
| JP | 2004-274430 | 9/2004 |
| WO | WO 00/45420 | 8/2000 |

* cited by examiner

RADIO FREQUENCY CIRCUIT MODULE

CLAIM OF PRIORITY

The present application claims priority from Japanese application JP 2004-029111 filed on Feb. 5, 2004, the content of which is hereby incorporated by reference into this application.

FIELD OF THE INVENTION

The present invention relates to a radio frequency (RF) circuit module that is employed in wireless communication equipment and, in particular, to the RF circuit module in which a power amplifier and an RF transceiver are formed on a single module substrate and thus united in an RF block.

BACKGROUND OF THE INVENTION

One technique for downsizing portable equipment is circuit integration of electronic circuits and another is module implementation, that is, assembling multiple electronic circuit units in one module. The module implementation method is widely used for RF circuit blocks of wireless communication equipment to achieve high performance of the circuit blocks at low cost (for instance, refer to Published Japanese Translation of PCT International Publication for Patent Application No. 2002-536819).

SUMMARY OF THE INVENTION

The module implementation has two main merits. One merit is downsizing. If attempts are made to implement circuit on a motherboard, using discrete components such as packaged components, the packaged components must be disposed with a certain degree of gap left between adjacent ones, from the perspective of a viewpoint of the mounting process and yield. By contrast, in a module using bare-chip components, the components can be mounted with fewer gaps between adjacent ones and, consequently, the same circuit can be made smaller in the finished module. Another merit is easiness to design and manufacture equipments. In designing RF circuit blocks, specialized expertise and knowledge are needed to solve problems such as impedance matching, electromagnetic interference, and oscillation. Because modules in which these problems have been cleared are delivered to a set manufacturer, the set manufacturer does not need to make a circuit design for the circuits provided in the modules and, thus, a set can be developed for a shorter period. Moreover, in comparison with the case where discrete components are mounted, the equipments employing the modules have a less number of components to be handled and, therefore, make it easy to manage and mount the components, and eliminate the need for additional tasks such as adjustment after manufacturing.

The RF circuit block of wireless communication equipment, e.g., a cellular phone for GSM (Global System for Mobile Communications), is generally made up of a power amplifier (hereinafter referred to as "PA") module, an antenna duplex circuit module, a low pass filter (hereinafter referred to as "LPF") for transmission, a band pass filter (hereinafter referred to as "BPF") for reception, and a radio frequency integrated circuit (hereinafter referred to as "RF-IC").

In the RF-IC, receive circuits including a low noise amplifier (hereinafter referred to as "LNA"), a receiver, etc., a transmitter, a voltage control oscillator (hereinafter referred to as "VCO"), and other components are integrated. These circuits may be assembled in an IC other than the RF-IC or a module. The sections operate as follows, respectively.

First, in transmit operation, a voice input from a microphone is encoded by a base band large scale integrated circuit (hereinafter referred to as "BB-LSI"), then modulated into a transmit signal, and the frequency of this signal is converted into a transmitting frequency by the transmitter in the RF-IC. After frequency conversion, the RF transmit signal is amplified by the PA and unwanted harmonics are removed from the signal by the transmitting LPF, and, after passing through the antenna duplex circuit, the RF transmit signal is emitted from an antenna.

Next, in receive operation, an RF receive signal received by the antenna goes through the antenna duplex circuit and unwanted interference noise is removed from the signal by the receiving BPF, and, after amplified by the LNA in the RF-IC, the frequency of RF receive signal is converted into the frequency of a receive signal by the receiver in the RF-IC. The receive signal is demodulated and decoded by the BB-LSI, then output from a speaker. A local oscillation signal with a specific frequency, generated by the VCO in the RF-IC, is used for the frequency conversion by the transmitter and the receiver.

The module implementation of the whole of such an RF circuit block of wireless communication equipment poses a problem of signal interference between the circuits in the module. A method for reducing the interference between the circuits mounted in the module is described in the above-mentioned patent document. A multi-chip module disclosed in this document comprises a single interconnect substrate, a first RF/IF active circuit chip which performs a first RF/IF function, bonded to the single interconnect substrate, and a second RF/IF active circuit chip which performs a second RF/IF function, bonded to the single interconnect circuit; these circuit chips are integrated on the single interconnect substrate. The substrate further includes a first ground plane which is functionally associated with the first RF/IF active circuit chip and a second ground plane which is functionally associated with the second RF/IF active circuit chip. Thereby, this module accomplishes RF signal isolation between the first and second active circuit chips.

In the above multi-chip module of prior art, however, circuits for which RF signal isolation should be performed are not identified. Consequently, in order to implement the whole RF circuit block of wireless communication equipment in a module by the multi-chip module technique of prior art, RF signal isolation between circuits must be performed for all circuit blocks in the module or circuits that require RF signal isolation must be determined by repeating trial manufacture. In the former, a problem in which the module size will be larger was presented; in the latter, a program in which the module development period will be longer was presented.

In the above multi-chip module of prior art, no consideration was taken for thermal isolation of a circuit that is susceptible to heat from a circuit that operates, while generating a greater amount of heat in the module.

Furthermore, in the above multi-chip module of prior art, separate ground planes are connected to separate ground pads on the under surface (reverse side) of the module and the pads are terminated to the ground plane of the motherboard. Thus, the potential of the ground pads varies, depending on what type of a ground land selected by the set manufacturer and provided on the motherboard, which caused a problem in which the circuits in the module oscillate or the performance decreases.

It is an object of the present invention to provide an RF circuit module with reduced interference between its electronic circuit blocks in the RF circuit module implementation of the whole RF circuit block of wireless communication equipment, that is, the module in which the power amplifier and the transceiver are united.

It is another object of the present invention to provide a downsized RF circuit module that still has high performance.

It is a further object of the present invention to provide a new RF circuit module that has a stable performance not dependent on the ground land structure on the motherboard.

A first aspect of the present invention, built to achieve the foregoing objects, resides in a radio frequency circuit module comprising a module substrate; first circuit (e.g., a transceiver) to which a first signal (e.g., transmit signal) is input and which outputs a second signal (e.g., RF transmit signal) with a higher frequency than the first signal, and moreover, to which a third signal (e.g., RF receive signal) is input and which outputs a fourth signal (e.g., receive signal) with a lower frequency than the third signal; second circuit (e.g., a power amplifier) which amplifies the second signal power level; a structure with ground planes for reducing signal interference between the first circuit and the second circuit; and a common ground plane to which all ground planes of the structure with ground planes are connected, wherein the first circuit and the second circuit are mounted on the module substrate.

A second aspect of the present invention, built to achieve the foregoing objects, resides in a radio frequency circuit module comprising a module substrate; first circuit (e.g., a transceiver) to which a first signal (e.g., transmit signal) is input and which outputs a second signal (e.g., RF transmit signal) with a higher frequency than the first signal, and moreover, to which a third signal (e.g., RF receive signal) is input and which outputs a fourth signal (e.g., receive signal) with a lower frequency than the third signal; second circuit (e.g., a power amplifier) which amplifies the second signal power level; a first ground plane for the first circuit; and a second ground plane for the second circuit, electrically isolated from the first ground plane mutually, wherein the first circuit and the second circuit are mounted on the top face of the module substrate, and wherein the first and second ground planes are located on conductor layers of the module substrate. The radio frequency circuit module of the second aspect is preferably structured as follows: the module substrate is configured such that a third ground plane can be mounted on its reverse side and, if the third ground plane has been mounted, the first and second ground planes are electrically connected to the third ground plane and the third ground plane serves as a common ground plane for the first and second ground planes. Alternatively, the radio frequency circuit module of the second aspect preferably further comprises a common ground plane for the first and second circuit, included in the module substrate, wherein the common ground plane is located on another conductor layer that is closer to the reverse side of the module substrate than the conductor layers on which the first and second ground planes are located and the first and second ground planes are electrically connected to the common ground plane.

In the RF circuit module, which is a single module configuration of the whole RF circuit block of wireless communication equipment, namely, the first circuit and the second circuit, e.g., the transceiver and the power amplifier, the ground plane for the power amplifier which generates the greatest electric power, thus produces a large current flow and a great amount of heat, is isolated from the other ground planes; consequently, signal interference caused by a part of the large current flowing into the other circuits is reduced. Since electric conductors are good thermal conductors, the ground planes are electrically isolated from each other, thus leading to the cutoff of both electric conduction and thermal conduction therebetween. The present invention enables RF signal isolation and thermal isolation only in the most proper places as above, and therefore, the RF circuit module can be downsized, while the component circuits still have high performances. The module has the common ground plane to which all ground planes of the first and second ground planes are connected; consequently, reference potential for all RF circuits is fixed, not dependent on the ground land on the motherboard and, therefore, a stable performance can be achieved.

Preferably, the above radio frequency circuit module of the present invention is, further, configured as follows.

(1) The ground terminal of a last-stage amplifier of the power amplifier is connected to the first ground plane and the ground terminals of the transmitter to which a transmit signal is input and which outputs an RF transmit signal, included in the transceiver, are connected to the second ground plane.

(2) The ground terminal of the last-stage amplifier of the power amplifier is connected to the first ground plane and the ground terminals of receive circuits to which an RF receive signal is input and which outputs a receive signal, included in the transceiver, are connected to the second ground plane.

(3) The module further comprises an antenna duplex circuit which allows the RF transmit signal to go to an external antenna and allows the RF receive signal from the antenna to go to the receive circuits to which the RF receive signal is input and which outputs the receive signal, included in the transceiver, and a third ground plane which is electrically isolated from the second ground plane, wherein the ground terminals of the antenna duplex circuit are connected to the third ground plane and the third ground plane is connected to the common ground plane.

(4) The ground terminal of the last-stage amplifier of the power amplifier is connected to the first ground plane and the ground terminal of a voltage control oscillator which generates local oscillation signals that are used for frequency conversion of the transmit signal frequency into the RF transmit signal frequency and frequency conversion of the RF receive signal frequency into the receive signal frequency, included in the transceiver, is connected to the second ground plane.

(5) The module further comprises the third ground plane, which is electrically isolated from the second ground plane, wherein the ground terminals of the transmitter to which the transmit signal is input and which outputs the RF transmit signal, included in the transceiver, are connected to the second ground plane, the ground terminal of the voltage control oscillator which generates local oscillation signals that are used for frequency conversion of the transmit signal frequency into the RF transmit signal frequency and frequency conversion of the RF receive signal frequency into the receive signal frequency, included in the transceiver, is connected to the third ground plane, and the third ground plane is connected to the common ground plane.

(6) The module further comprises the third ground plane which is electrically isolated from the second ground plane, wherein the ground terminals of the receive circuits to which the RF receive signal is input and which outputs the receive signal, included in the transceiver, are connected to the second ground plane, the ground terminal of the voltage control oscillator which generates local oscillation signals that are used for frequency conversion of the transmit signal frequency into the RF transmit signal frequency and frequency conversion of the RF receive signal frequency into the receive signal frequency, included in the transceiver, is connected to the third ground plane, and the third ground plane is connected to the common ground plane.

(7) The module further comprises the third ground plane which is electrically isolated from the second ground plane, a fourth ground plane, the antenna duplex circuit which allows the RF transmit signal to go to an external antenna and allows the RF receive signal from the antenna to go to the receive circuits to which the RF receive signal is input and which outputs the receive signal, included in the transceiver, and an output matching network for impedance matching between the antenna duplex circuit and the last-stage amplifier of the amplifier, wherein the ground terminal of the last-stage amplifier is connected to the first ground plane, the ground terminals of the antenna duplex circuit are connected to the third ground plane, the ground terminals of the output matching network are connected to the fourth ground plane, and the fourth ground plane is electrically isolated from at least one of the first through third ground planes.

A further aspect of the present invention, built to achieve the foregoing objects, resides in a radio frequency circuit module comprising a module substrate; the transmitter to which the transmit signal is input and which outputs the RF transmit signal; the receive circuits to which the RF receive signal is input and which outputs the receive signal; the power amplifier to amplify the RF transmit signal power level; the first ground plane for the power amplifier; the second ground planes for the transmitter; the third ground plane for the receive circuits, wherein these ground planes are isolated from each other, and the common ground plane. The transmitter, receive circuits, and power amplifier are mounted on the top face of the module substrate. The first through third ground planes and the common ground plane are located on conductor layers of the module substrate. The conductor layer on which the common ground plane is present is closer to the reverse side of the module substrate, lower than the conductor layers on which the first through third ground planes are located. The first through third ground planes are electrically connected to the common ground plane.

Because the ground plane for the power amplifier which generates the greatest power, thus produces a large current flow, is isolated from the ground planes for other component circuits, signal interference caused by a part of the large current flowing into the other circuits is reduced. In addition, because the second and third ground planes are isolated from each other, signal interference between the transmitter and the receive circuits is also reduced. Thus, the RF circuit module that is suitable for use in a Frequency Division Duplex (FDD) communication system where the transmitter and the receive circuits operate simultaneously can be implemented.

These and other objects and many of the attendant advantages of the invention will be readily appreciated, as the same becomes better understood by reference to the following detailed description when considered in connection with the accompanying drawings.

DETAILED DESCRIPTION OF THE PREFERRED EMBODIMENTS

The RF circuit module of the present invention will be described fully hereinafter with reference to its some preferred embodiments which are shown in the drawings. In FIGS. 1 through 14, the same reference numbers are used to identify the same or similar components.

Figure 1:
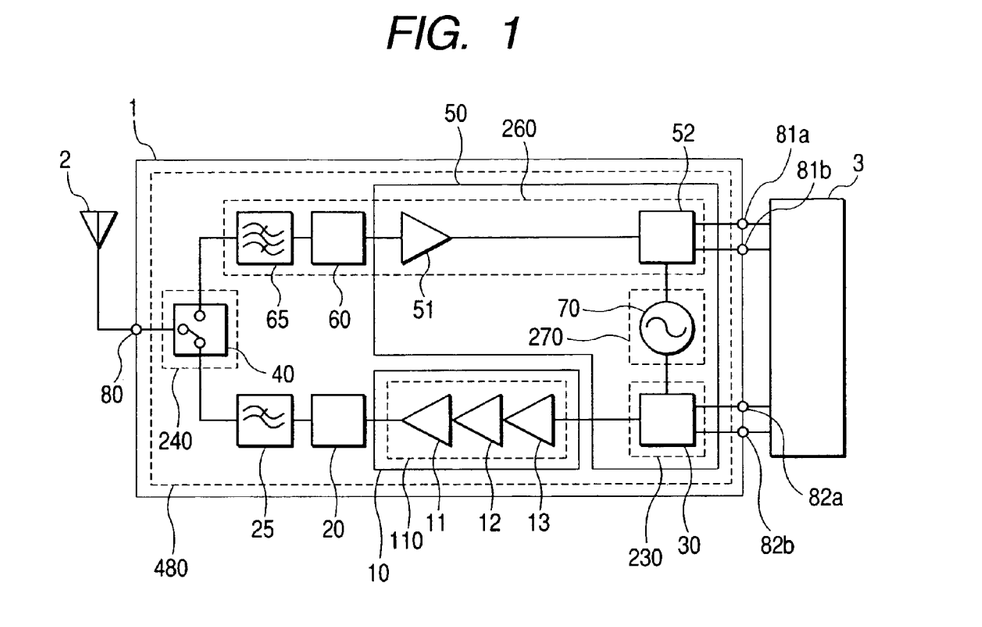
FIG. 1 is a circuit block diagram for explaining a first embodiment of the RF circuit module of the present invention.
Figure 2:
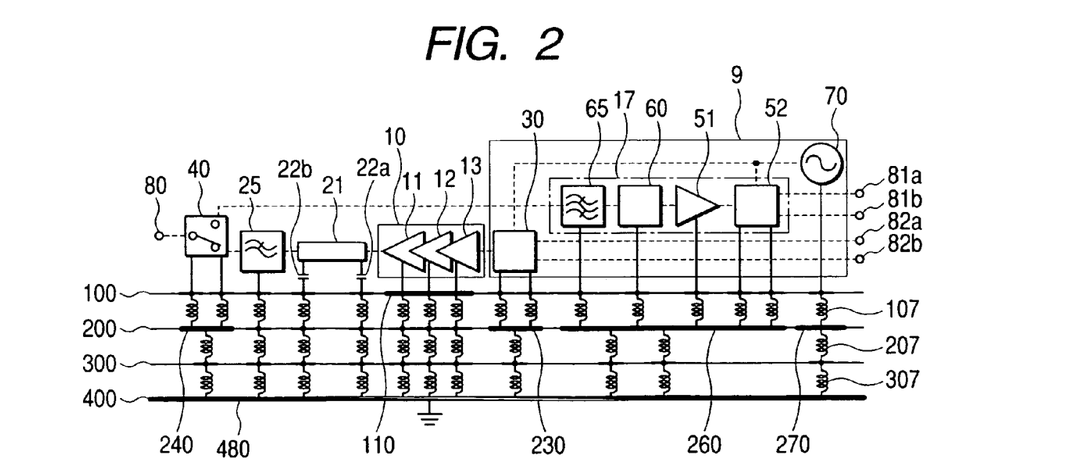
FIG. 2 is a diagram depicting connections to ground planes for explaining the first embodiment of the present invention.

A first embodiment of the RF circuit module for cellular phones for GSM, to which the present invention is applied, is discussed, using FIGS. 1 through 10. First, the configuration of the RF circuit module 1 of the first embodiment is shown in FIG. 1. The circuit arrangement where connections to ground planes are specifically expressed is shown in FIG. 2. The module 1 is essentially comprised of first circuit 9 and second circuit 10. The first circuit 9 is comprised of third circuit 30 to which a first signal is input and which outputs a second signal with a higher frequency than the first signal and fourth circuit 17 to which a third signal is input and which outputs a fourth signal with a lower frequency than the third signal. The second circuit amplifies the second signal power level. The first circuit 9, second circuit, third circuit 30, and fourth circuit 17 are able to function as a transceiver, power amplifier, transmitter, and receive circuits, respectively. The chain of the receive circuits which are constituents of the transceiver is comprised of, e.g., a receiving BPF 65, receiving matching network 60, LNA 51, and receiver 52 in the first embodiment example. Hereinafter, the first circuit 9, second circuit, third circuit 30, and fourth circuit 17 will be again referred to as the transceiver 9, power amplifier 10, transmitter 30, and receive circuits 17, respectively.

To the foregoing basic structure of the module 1, more specifically, an output matching network 20 and an LPF 25 located in the output line of the transmitter 30 are added and a switch (antenna duplex circuit) 40 which switches between the connections of an antenna 2 to the transmission chain and the reception chain is added, and, to the transceiver 9, a VCO 70 which is commonly used for the transmitter 30 and the receiver 52 is added. Detail of the overall structure of the module 1 including these additional circuits will be discussed below.

The module 1, in the transmission chain, is configured with the transmitter 30 which converts the frequency of a transmit signal (an example of the first signal) which is output from an external BB-LSI 3 and input to it through input terminals 82*a*, 82*b* into a transmitting frequency (the transmitter 30 includes a transmitting mixer, a quadrature modulator, etc., which are not shown, for frequency conversion), the PA 10 which amplifies the power level of an RF transmit signal (an example of the second signal) output from the transmitter 30, and the LPF 25 to which the RF transmit signal output from the PA 10 is input via the output matching network 20 and which removes unwanted harmonics included in the RF transmit signal. In addition, the module 1 has the switch 40 which connects to the external antenna 2 via an antenna terminal 80 and which allows the RF transmit signal from the LPF 25 to go to the antenna 2 during transmission and allows an RF receive signal (an example of the third signal) from the antenna 2, input to it via the antenna terminal 80, to go to the reception chain during reception. The switch 40 is the antenna duplex circuit which performs this switching operation. Furthermore, the module 1, in the reception chain, is configured with the receiving BPF 65 which removes unwanted interference noise from the RF receive signal from the switch 40, the LNA 51 which amplifies the power level of the receive signal output from the receiving BPF 65 and input to it via the receiving matching network 60, and the receiver 52 which converts the frequency of the RF receive signal output from the LNA 51 into the frequency of a receive signal (an example of the fourth signal) and supplies the receive signal to the BB-LSI 3 through output terminals 81*a*, 81*b* (the receiver 52 includes a receiving mixer, a quadrature demodulator, etc., which are not shown, for frequency conversion).

Here, the transmit signal which is output from the BB-LSI 13 and the receive signal which is input to the BB-LSI 13 are in a frequency band of about 200 kHz and the RF transmit signal which is output from the transmitter 30 and the RF receive signal which is input to the receiver 52 are in a frequency band of 900 MHz. The above frequencies are exemplary and the present invention is not limited to these frequencies.

In the above module structure, an RF-IC 50 is configured on which the transmitter 30, LNA 51, receiver 52, and VCO 70 which generates local oscillation signals for frequency conversion and supplies the signals to the transmitter 30 and receiver 52 are integrated. The receiving BPF 65, receiving matching network 60, LNA 51, and receiver 52 constitute the chain of the receive circuits 17. The transmitter 30 and the VCO 70 together with the receive circuits constitute the transceiver 9. The PA 10 is a three-stage power amplifier consisting of a last-stage amplifier 11, middle-stage amplifier 12, and first-stage amplifier 13, which are integrated in an IC chip structure. The output matching network 20 is a circuit to match the output impedance of the PA 10 and the input impedance of the LPF 25 and the receiving matching network 60 is a circuit to match the impedances between the receiving BPF 65 and the LNA 51. The above circuits and chips are mounted on the substrate of the module 1.

In the first embodiment, the constituent circuits are grounded to separate ground planes (a structure with ground planes) provided for each and eventually grounded to a common ground plane 480. The common ground plane may be incorporated into the module or added to the module as an external component. The manner in which the common ground plane should be incorporated into the module produces an effect that the set manufacturer does not have to do the work of adding a common ground plane. The manner in which the common ground plane should be added to the module produces an effect that the set manufacturer is given freedom in which a common ground plane with desired characteristics can be chosen at the discretion of the set manufacturer.

The separate ground planes (the structure with ground planes) are a transmitter ground plane 230 for the transmitter 30, a PA ground plane 110 for the PA 10, an antenna duplex circuit ground plane 240 for the switch 40, a receive circuits ground plane 260 for the receiving BPF 65, receiving matching network 60, LNA 51, and receiver 52, and a VCO ground plane 270 for the VCO 70. These separate ground planes are electrically isolated from each other as they are and function as the ground only by termination to the common ground plane 480.

In FIG. 2, the substrate of the module 1 is a layered composite consisting of three dielectric substrates which will be described later; from the top, a first conductor layer 100, second conductor layer 200, third conductor layer 300, and fourth conductor layer 400 are formed in order. The circuits in the present RF circuit module are associated with the isolated ground planes as follows.

The PA ground plane 110 to which the ground terminals of the PA 10 are connected is located on the first conductor layer 100. The transmitter ground plane 230 to which the ground terminals of the transmitter 30 are connected, the antenna duplex circuit ground plane 240 to which the ground terminals of the switch 40 are connected, the receive circuits ground plane 260 to which the ground terminals of the receiving BPF 65, receiving matching network 60, LNA 51, and receiver 52 are connected, and the VCO ground plane 270 to which the ground terminal of the VCO 70 is connected are located on the second conductor layer 200. Moreover, the common ground plane 480 is present on the fourth conductor layer 400.

Interlayer connections are made by interlayer via-holes that serve as connection conductors. For example, the ground terminal of the VCO 70 is connected to the VCO ground plane 270 through a 1st-2nd interlayer via-hole 107 and the VCO ground plane 270 is connected to the common ground plane 480 through a 2nd-3rd interlayer via-hole 207 and a 3rd-4th interlayer via-hole 307. Likewise, the connection terminals of the transmitter 30 and the switch circuit 40 are connected to the transmitter ground plane 230 and the antenna duplex circuit ground plane 240 respectively through 1st-2nd interlayer via-holes and the transmitter ground plane 230 and the antenna duplex circuit ground plane 240 are connected to the common ground plane 480 through 2nd-3rd interlayer via-holes and 3rd-4th interlayer via-holes. The ground terminals of the receiving BPF 65, receiving matching network 60, LNA 51, and receiver 52 are connected to the receive circuits ground plane 260 through 1st-2nd interlayer via-holes and the receive circuits ground plane 260 is connected to the common ground plane 480 through 2nd-3rd interlayer via-holes and 3rd-4th interlayer via-holes.

The PA ground plane 110 is connected to the common ground plane 480 through a plurality of 1st-2nd interlayer via-holes, 2nd-3rd interlayer via-holes, and 3rd-4th interlayer via-holes.

Then, the output matching network 20 is comprised of a transmission line 21 and capacitors 22*a*, 22*b* and the ground terminals of the capacitors 22*a*, 22*b* are connected to the common ground plane 480 through 1st-2nd interlayer via-holes, 2nd-3rd interlayer via-holes, and 3rd-4th interlayer via-holes. Besides, the ground terminal of the LPF 25 is connected to the common ground plane 480 through a 1st-2nd interlayer via-hole, 2nd-3rd interlayer via-hole, and 3rd-4th interlayer via-hole. The receiving matching network 60 consists of two passive elements, which are not shown in FIG. 2, and the ground terminal of one passive element is connected to the receive circuits ground plane 260 through a 1st-2nd interlayer via-hole. In FIG. 2, signal paths are denoted by dotted lines.

Figure 3:
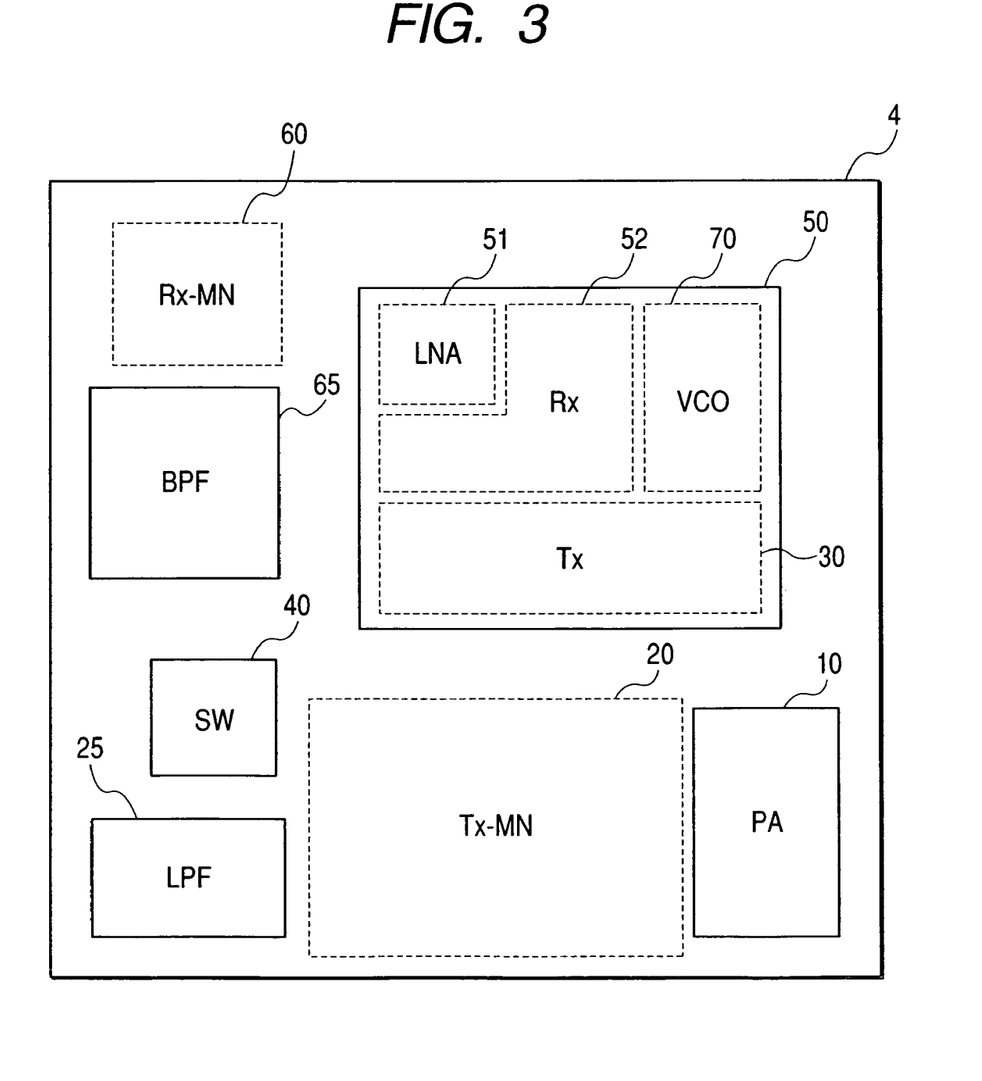
FIG. 3 is a layout plan of components for explaining the first embodiment of the present invention.

The LPF 25, switch (SW) 40, and BPF 65 are constructed as chip components. FIG. 3 is a layout plan in which these components, the IC chip of the PA 10, the RF-IC 50, the output matching network (Tx-MN) 20 consisting of passive components, and the receiving matching network (Rx-MN) 60 are mounted on the substrate 4 of the module 1. In FIG. 3, the transmitter 30 is denoted by Tx and the receiver 52 is denoted by Rx.

Figure 4:
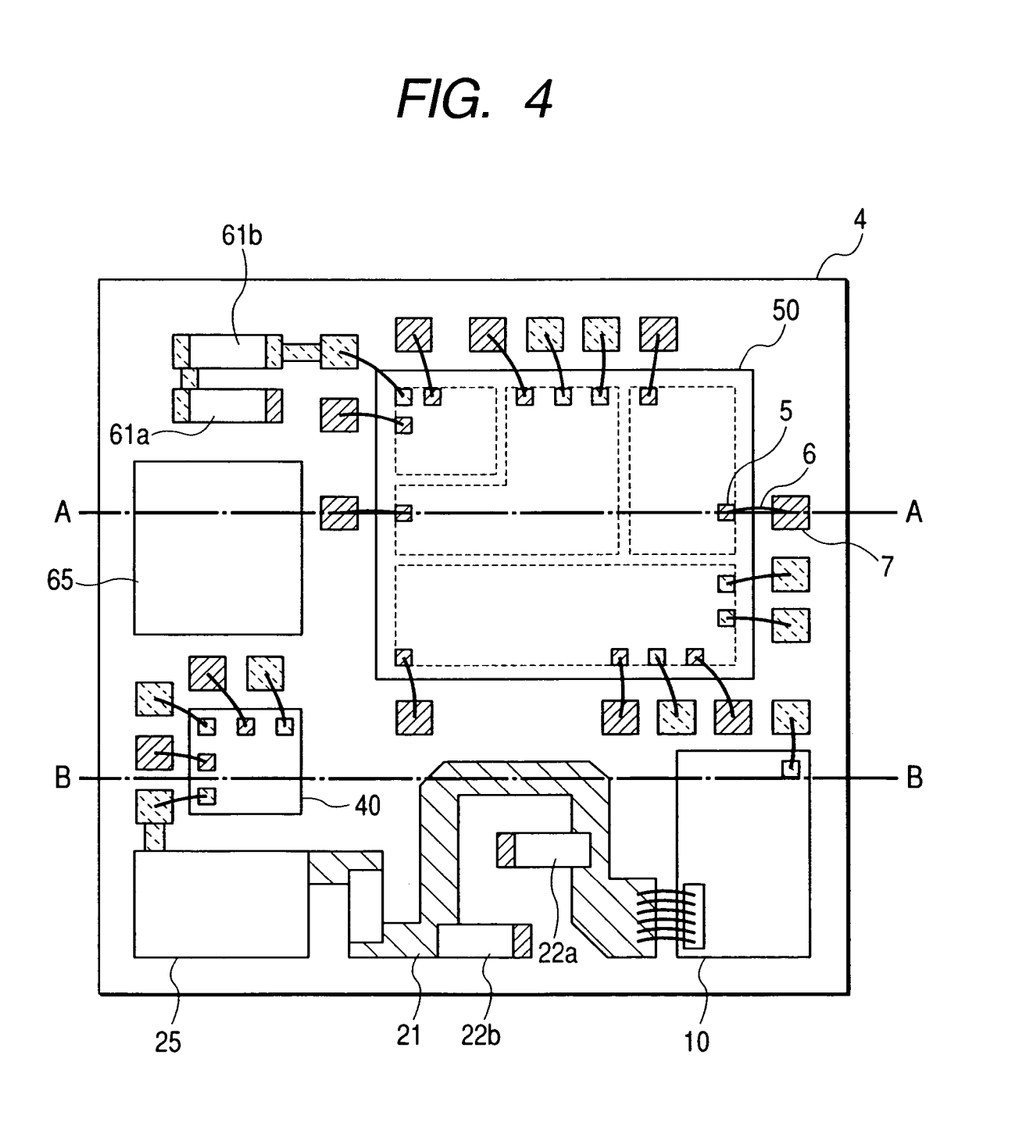
FIG. 4 is a top plan view for explaining the first embodiment of the present invention.

FIG. 4 is a top plan view of the module 1. The RF-IC 50 and the switch 40 are mounted with their circuit sides up on the module substrate 4 and signal and ground pads are disposed on their top surfaces. On the substrate 4, namely, the first conductor layer 100, signal and ground bonding pads are also disposed. Every signal pad is denoted by a thin pattern and every ground pad is denoted by a thick pattern.

The pads on the top faces of the chips are connected to the corresponding bonding pads on the substrate 4 by bonding wires. For example, a ground pad 5 for the VCO 70 on the chip is connected to a bonding pad 7 on the first conductor layer 100 by a bonding wire 6. As shown in FIG. 2, the bounding pad 7 is connected to the VCO ground plane 270 located on the second conductor layer 200 through the 1st-2nd interlayer via-hole 107.

Although, in this example, the RF-IC 50 and the switch 40 are mounted with their circuit sides up on the module substrate and their ground terminals are connected to the bonding pads on the module substrate by bonding wires, a flip chip connection process where the chips are mounted with their circuit sides down and their ground terminals are connected to the bonding pads by solder bumping may be applied.

The ground terminals of all amplifier elements of the PA 10 are located (not shown) on the reverse side of the PA chip and connected to the PA ground plane 110 located on the first conductor layer 100 by using Ag paste. A signal pad is located on the top face of the PA 10. The transmission line 21 of the transmitting matching network 20 is formed of a conductor pattern formed on the first conductor layer 100. The two passive elements of the receiving matching network 60 are denoted by 61a, 61b and the ground terminal of one passive element 61a is connected to the receive circuits ground plane 260 through the 1st-2nd interlayer via-hole.

Figure 5:
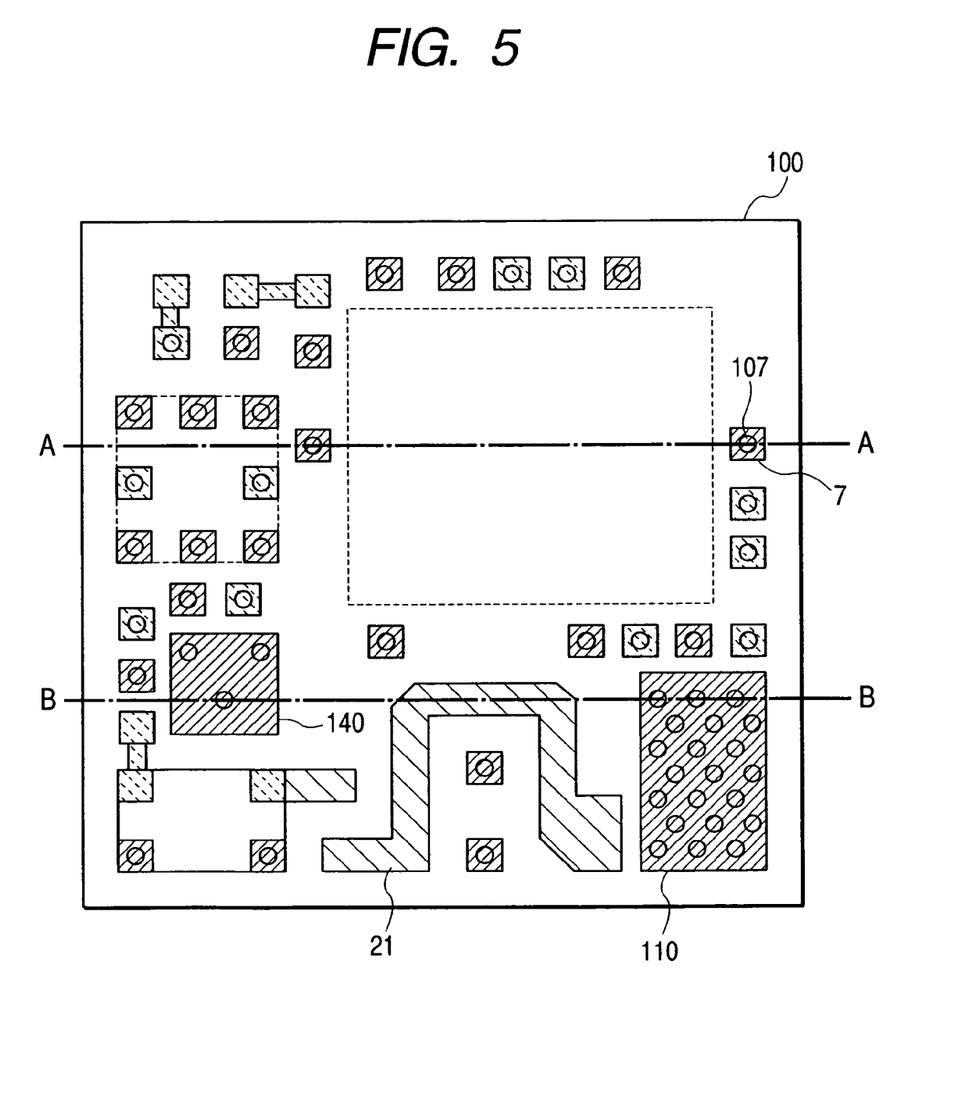
FIG. 5 is an illustration of conductor pattern formation on the first conductor layer for explaining the first embodiment of the present invention.
Figure 6:
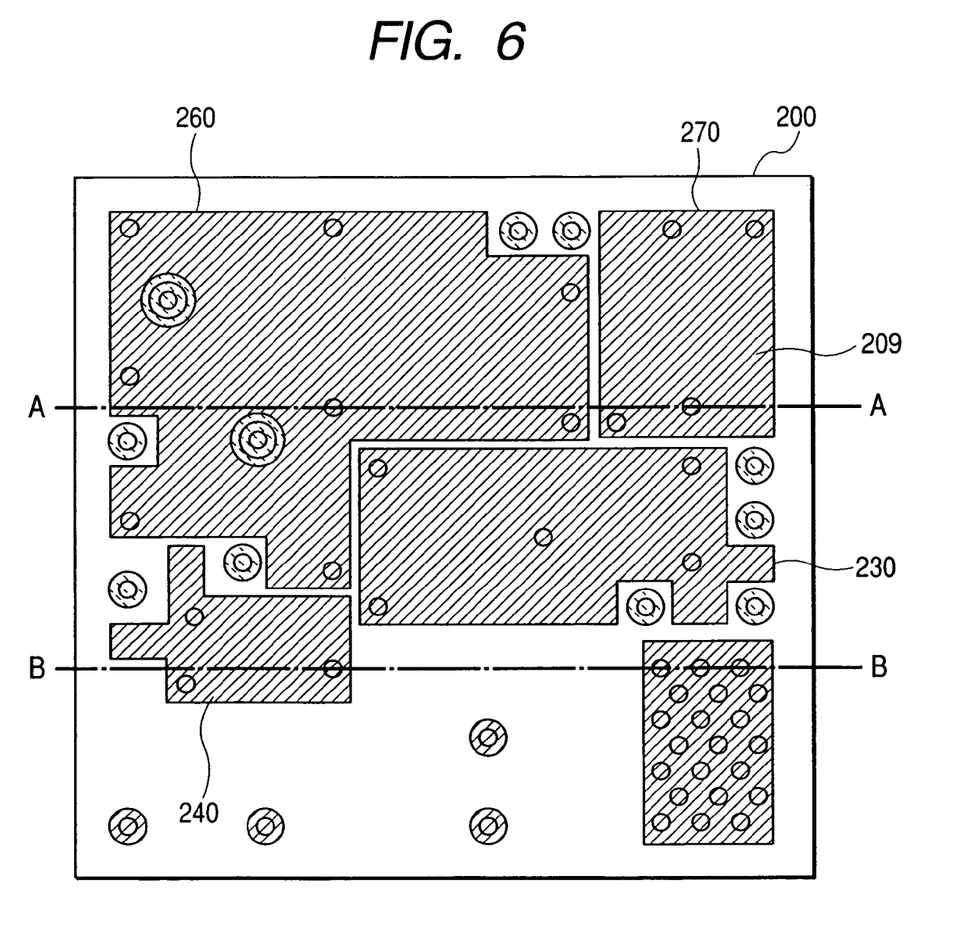
FIG. 6 is an illustration of conductor pattern formation on the second conductor layer for explaining the first embodiment of the present invention.
Figure 7:
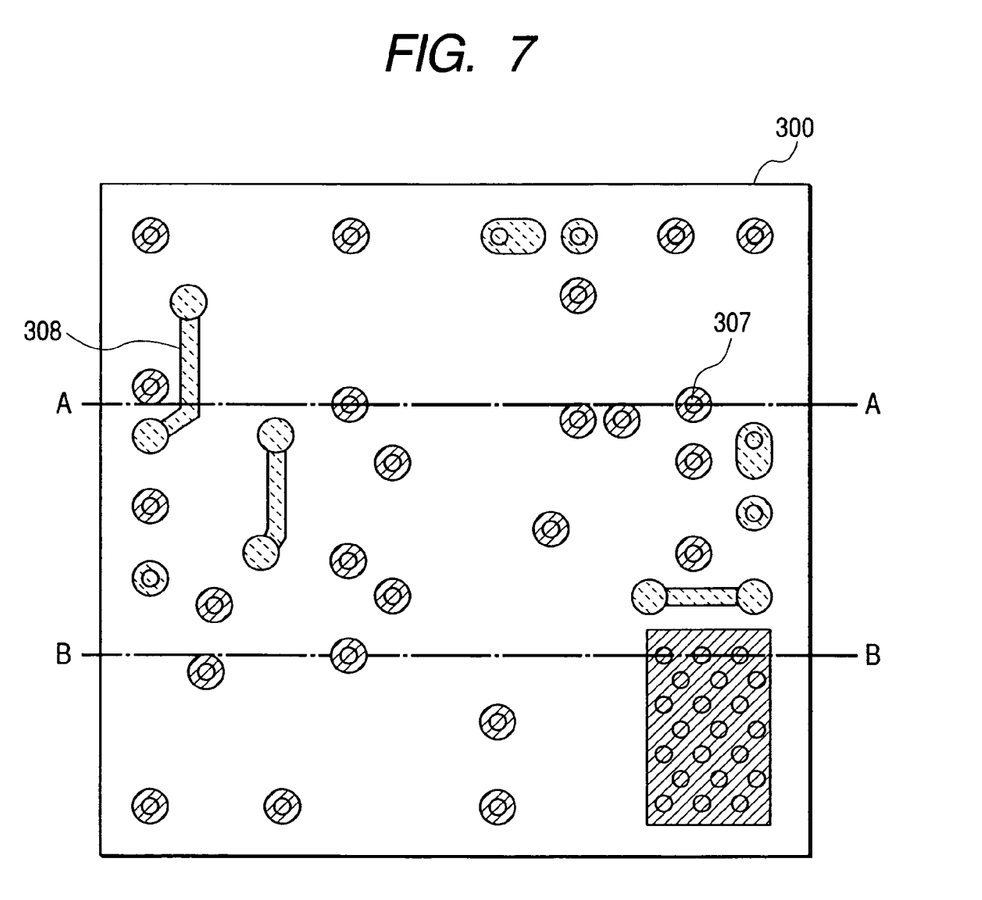
FIG. 7 is an illustration of conductor pattern formation on the third conductor layer for explaining the first embodiment of the present invention.
Figure 8:
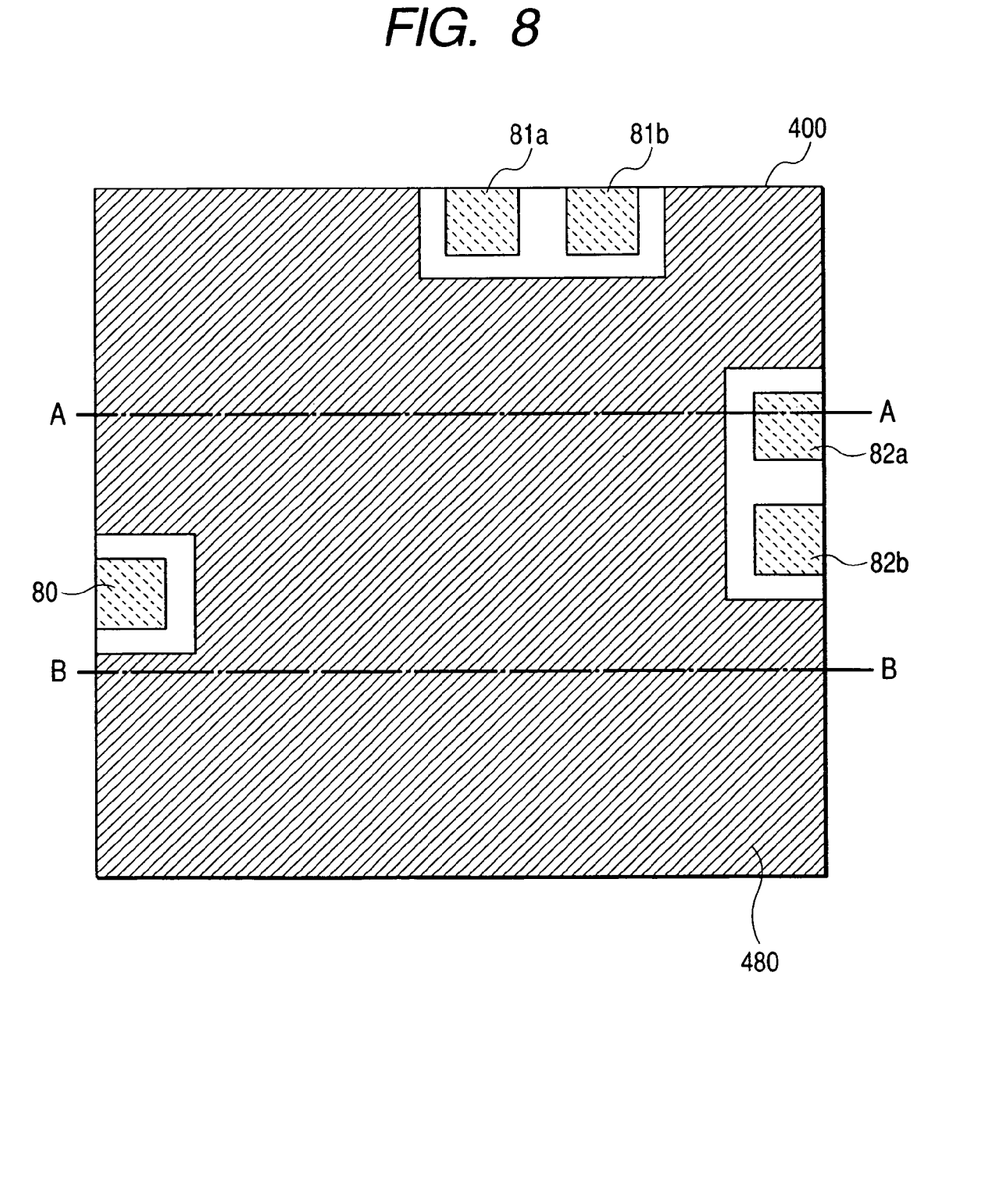
FIG. 8 is an illustration of conductor pattern formation on the fourth conductor layer for explaining the first embodiment of the present invention.

Then, FIG. 5 shows conductor pattern formation on the first conductor layer 100; FIG. 6 shows conductor pattern formation on the second conductor layer 200; FIG. 7 shows conductor pattern formation on the third conductor layer 300; and FIG. 8 shows conductor pattern formation on the fourth conductor layer 400. The ground terminals of the switch 40 are located (not shown) on the reverse side of the switch chip and connected to the switch ground plane 140 located on the first conductor layer 100, shown in FIG. 5, by using Ag paste. A signal conductor pattern 308 from the BPF 65 and the receiving matching network 60 is shown in FIG. 7.

Figure 9:
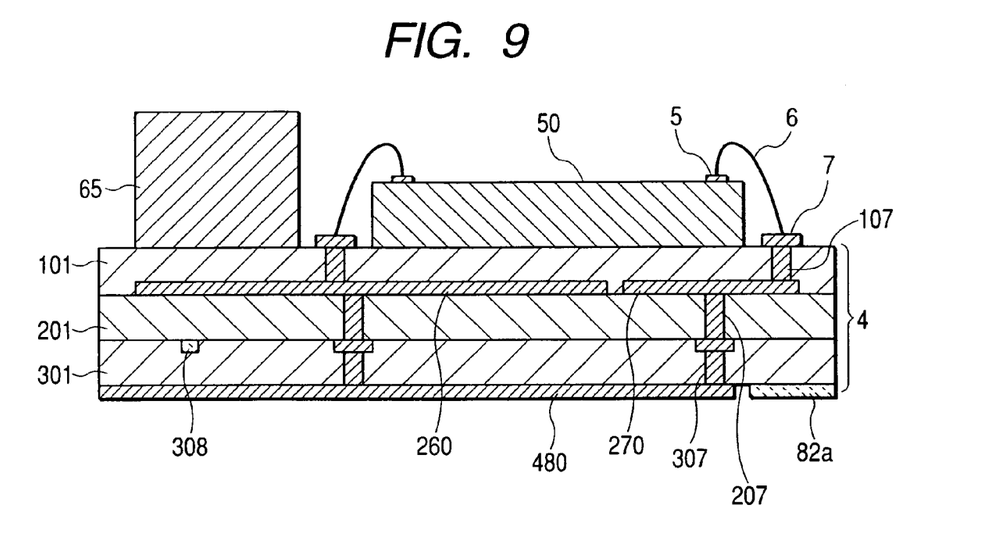
FIG. 9 is a cross-sectional diagram of line A-A for explaining the first embodiment of the present invention.
Figure 10:
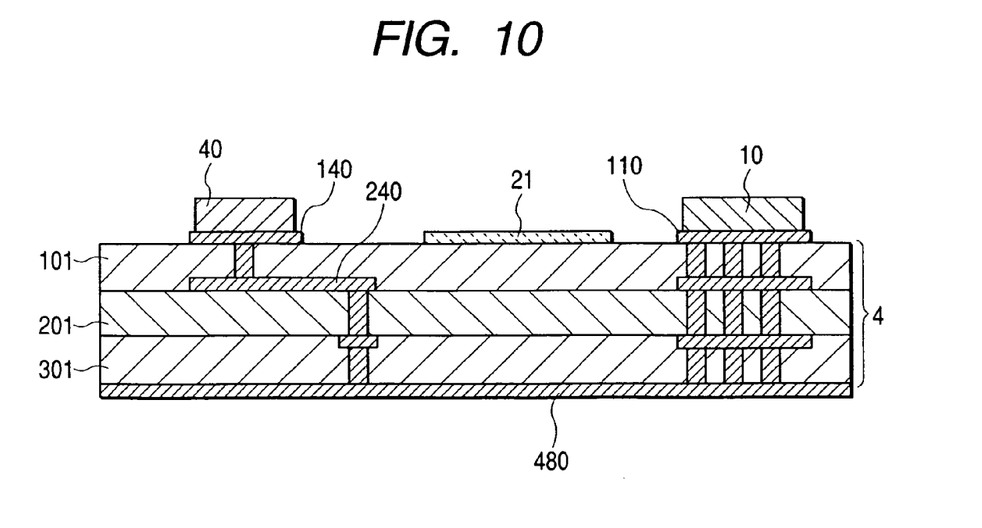
FIG. 10 is a cross-sectional diagram of line B-B for explaining the first embodiment of the present invention.

Then, FIG. 9 shows a cross section of line A-A in FIG. 4. The three dielectric layers, 101, 102, 103 of the substrate 4 are made of glass epoxy resin. Moreover, FIG. 10 shows a cross section of line B-B. The switch ground plane 140 of the switch 40 is connected to the antenna duplex circuit ground plane 240 through a 1st-2nd interlayer via-hole.

As described above, in the first embodiment, the PA ground plane 110, receive circuits ground plane 260, transmitter ground plane 230, VCO ground plane 270, antenna duplex circuit ground plane 240, and the output matching network ground plane, or broadly, the common ground plane 480 are isolated from each other. These ground planes except the output matching network ground plane are connected to the common ground plane 480 through interlayer via-holes serving as connection conductors. Since the interlayer via-holes generate a resistance component to RF signals by their self-inductance, the amount of RF resistance, in other words, the degree of isolation between the ground planes can be adjusted by the position of a conductor layer on which each ground plane is located and the number of interlayer via-holes employed. Since the interlayer via-holes have thermal resistance, the degree of thermal isolation between the ground planes can also be adjusted by the position of a conductor layer on which each ground plane is located and the number of interlayer via-holes employed.

By configuring the module as described above, the module is able to prevent the feedback of a current flowing across the common ground plane 480, or in a narrow sense, the output matching network ground plane into the receive circuits ground plane 260 as the result of heat and output current from the PA 10 where the greatest power is generated in the whole RF circuit block, that is, the source of generating the greatest noise and heat for the RF circuit block. The module is also able to effectively prevent the following problems: a decrease in the receiving sensitivity and malfunction of the LNA 51 due to increasing noise and a variation in the bandwidth of the receiving BPF 65 due to temperature rise. Moreover, the module is able to maintain a higher performance of the receive circuits 17 by isolation between the antenna duplex circuit ground plane 240 into which the transmit signal from the PA 10 flows and the receive circuits ground plane 260. Also, by isolation between the transmitter ground plane 230 and the receive circuits ground plane 260, the module is able to prevent a feedback current flowing into the receive circuits ground plane 260 as the result of heat and output current from the transmitter 30, thus maintaining a higher performance of the receive circuits 17.

Also, by mutual isolation of the PA ground plane 110, the common ground plane 480, or in a narrow sense, the output matching network ground plane, the transmitter ground plane 230, and the VCO ground plane 270, the module is able to prevent the feedback of a current flowing across the PA ground plane 110 and the common ground plane 480, or in a narrow sense, the output matching network ground plane into the transmitter ground plane 230 and the VCO ground plane 270 as the result of output current from the PA 10. The module is able to prevent oscillation of the power amplifier 10 and a decrease in the quality of local oscillation signals that the VCO 70 outputs, as the result of feedback of the output of the power amplifier 10 into the output of the transmitter 30.

Furthermore, by isolation between the receive circuits ground plane 260 and the VCO ground plane 270, the module is able to prevent a problem in which the receiving sensitivity of a desired receive signal is deteriorated due to that surplus local oscillation signals from the VCO 70 flow into the path in the receive circuits, in short, local oscillation signal leakage.

Because, in the first embodiment, the output matching network ground plane is a part of the common ground plane 480 that is present at the layer lowest than other ground planes when viewed from the circuit formation side (top face) of the module substrate, the distance between the transmission line 21 which is the main element of the output matching network 20 and its ground plane, namely, the common ground plane 480 is the greatest in the module substrate 1. Consequently, a width required to ensure that the transmission line 21 on the module substrate has certain characteristic impedance can be given equal to the maximum width of the multilayer substrate 4 employed; this can minimize transmission loss due to conductor loss.

As described above, according to the first embodiment, in the implementation of a single module form of the whole RF circuit block, namely, the power amplifier and the transceiver for cellular phones for GSM, without requiring the set manufacturer to make RF circuit design, RF signal isolation and thermal isolation can be provided only in the most proper places and, thus, the module can be downsized, while the component circuits still have high performances. By providing the module with the common ground plane 480 to which all ground planes are connected, reference potential for all RF circuits can be fixed, not dependent on the ground land on the motherboard. Thus, the RF circuit block with a stable performance can be provided.

Figure 11:
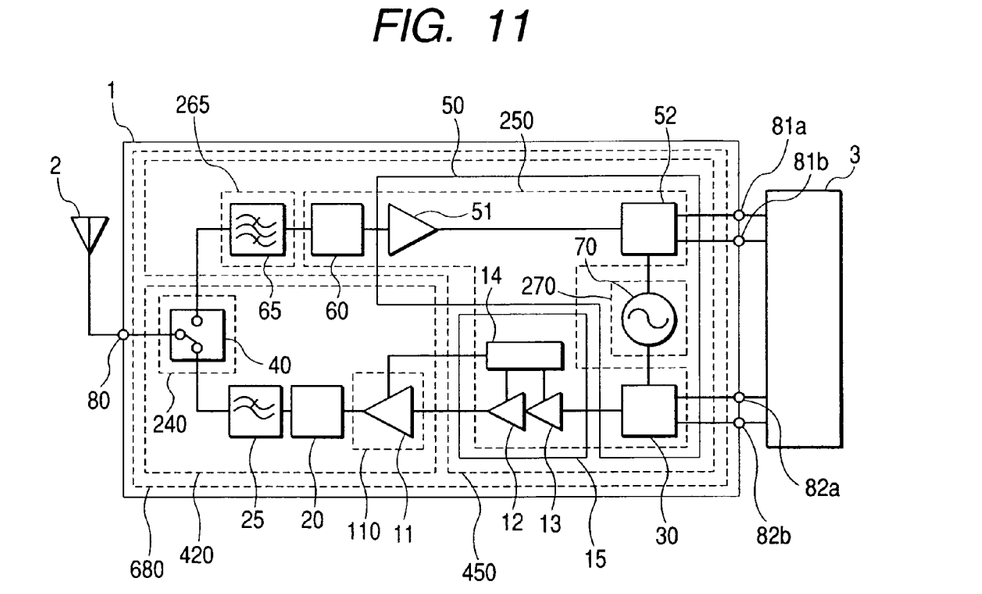
FIG. 11 is a circuit block diagram for explaining a second embodiment of the present invention.
Figure 12:
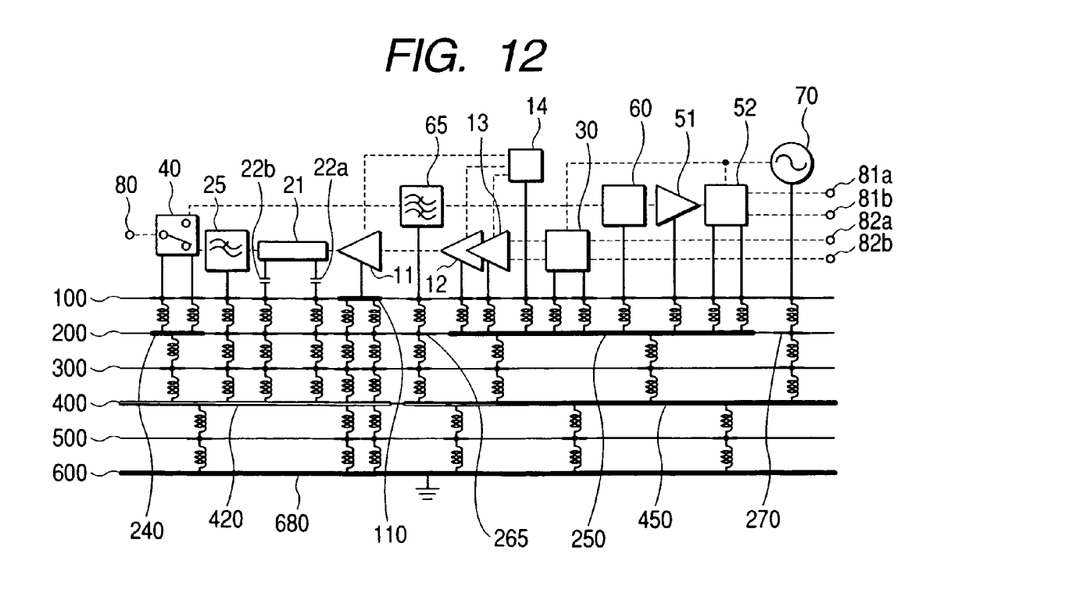
FIG. 12 is a diagram depicting connections to ground planes for explaining the second embodiment of the present invention.

A second embodiment of the RF circuit module for cellular phones for GSM, to which the present invention is applied, is discussed, using FIGS. 11 through 12. The second embodiment differs from the first embodiment in that the middle-stage amplifier 12 and first-stage amplifier 13 are separated from the last-stage amplifier 11 in the arrangement of the chips and that the multilayer substrate consists of five layers of ceramic substrates, provided with new intermediate ground planes.

In FIG. 11, a pre-stage amplifier 15 having a built-in power control circuit is an integrated circuit comprising the middle-stage amplifier 12, first-stage amplifier 13, and a power control circuit 14 which controls the gains of these amplifiers and the last-stage amplifier 11 present on another chip. Other circuits are the same as shown in FIG. 1. The above circuits and chips are mounted on the substrate of the module 1.

Separate ground planes are the PA ground plane 110 for the last-stage amplifier 11, the antenna duplex circuit ground plane 240 for the switch 40, an RF-IC ground plane 250 for the pre-stage amplifier 15 with the built-in power control circuit, transmitter 30, receiving matching network 60, LNA 51, and receiver 52, a receiving BPF ground plane 265 for the receiving BPF 65, and the VCO ground plane 270 for the VCO 70.

Besides, there are intermediate ground planes: a first intermediate ground plane 420 for the PA ground plane 110, output matching network 20, LPF 25 and the antenna duplex circuit ground plane 240; and a second intermediate ground plane 450 for the receiving BPF ground plane 265, RF-IC ground plane 250, and VC0 ground plane 270. Furthermore, there is a common ground plane 680 for the first intermediate ground plane 420 and the second intermediate ground plane 450.

Then, as shown in FIG. 12 which expresses the ground connections, the first conductor layer 100, second conductor layer 200, third conductor layer 300, fourth conductor layer 400, fifth conductor layer 500, and sixth conductor layer 600 are formed in order from the top in the multilayer substrate of the module 1. The circuits in the present RF circuit module are associated with the isolated ground planes as follows.

In FIG. 12, first, the ground terminal of the last-stage amplifier 11 is directly connected to the PA ground plane 110 located on the first conductor layer. The PA ground plane 110 is connected to the first intermediate ground plane 420 located on the fourth conductor layer 400 through 1st-2nd interlayer via-holes, 2nd-3rd interlayer via-holes, and 3rd-4th interlayer via-holes. The ground plane for the transmission line 21 which is the main element of the output matching network 20 is the first intermediate ground plane 420 and the ground terminals of the capacitors 22a and 22b which are also elements of the output matching network 20 are connected to the first intermediate ground plane 420 through 1st-2nd interlayer via-holes, 2nd-3rd interlayer via-holes, and 3rd-4th interlayer via-holes. Likewise, the ground terminal of the transmitting LPF 25 is connected to the first intermediate ground plane 420. The ground terminals of the switch 40 are connected to the antenna duplex circuit ground plane 240 located on the second conductor layer through 1st-2nd interlayer via-holes and the antenna duplex circuit ground plane 240 is connected to the first intermediate ground plane 420 through a 2nd-3rd interlayer via-hole and 3rd-4th interlayer via-hole.

Then, the ground terminals of the middle-stage amplifier 12, first-stage amplifier 13, power control circuit 14, transmitter 30, receiving matching network 60, LNA 51, and receiver 52 are connected to the RF-IC ground plane 250 located on the second conductor layer through 1st-2nd interlayer via-holes. The ground terminal of the receiving BPF 65 is connected to the receiving BPF ground plane 265 located on the second conductor layer through a 1st-2nd interlayer via-hole. The ground terminal of the VCO 70 is connected to the VCO ground plane 270 located on the second conductor layer through a 1st-2nd interlayer via-hole. The RF-IC ground plane 250, receiving BPF ground plane 265, and VCO ground plane 270 are connected to the second intermediate ground plane 450 located on the fourth layer through 2nd-3rd interlayer via-holes and 3rd-4th interlayer via-holes.

The first intermediate ground plane 420 and the second intermediate ground plane 450 are connected to the common ground plane 680 present on the sixth conductor layer 600 through 4th-5th interlayer via-holes and 5th-6th interlayer via-holes.

As above, in the second embodiment, the PA ground plane 110 for the ground terminal of the last-stage amplifier 11, the RF-IC ground plane 250, VCO ground plane 270, antenna duplex circuit ground plane 240, and output matching network ground plane, or broadly, the first intermediate ground plane 420 are isolated, and, therefore, the second embodiment produces the same effects as in the first embodiment.

Furthermore, a small surface acoustic wave filter with sharp bandwidth limiting characteristics is employed as the receiving BPF 65 and, consequently, the module of the second embodiment is further downsized with improved receiving performance. This module solves a thermal problem as follows. By isolation between the PA ground plane 110 and the RF-IC ground plane 250 for the ground terminals of the middle-stage amplifier 12 and first-stage amplifier 13 of the PA and the transmitter 30 and between the RF-IC ground plane 250 and the receiving BPF ground plane 265, the module is able to prevent temperature-induced variation in the bandwidth of the surface acoustic wave filter whose bandwidth limiting characteristics greatly vary with temperature change and achieve high performance.

In the second embodiment, as above, the ground planes for the circuits that carry large electric power in the section from the last-stage amplifier 11 of the PA to the antenna terminal 80 are connected to the first intermediate ground plane 420 and the ground planes for the remaining circuits are connected to the second intermediate plane 450 and these intermediate planes are connected to the common ground plane 680. Consequently, the module is able to effectively suppress the influence of the output of the last-stage amplifier 11 upon other circuits. In addition, one conductor layer exists between the layer with the ground planes and the intermediate ground plane layer and another conductor layer exists between the intermediate ground plane layer and the common ground plane layer; e.g., the third conductor layer 300 and fifth conductor layer 500 between the ground planes. Wiring on these conductor layers is arranged free from electromagnetic coupling to wiring on other conductor layer. Therefore, the wiring on the third conductor layer 300 and fifth conductor layer 500 can be routed freely and more flexibility can be given to the wiring layout internal to the module substrate.

In the second embodiment, both the ground terminals of the middle-stage amplifier 12 and first-stage amplifier 13 of the PA and the transmitter 30 and the ground terminals of the receiving matching network 60, LNA 51, and receiver 52 are connected to one ground plane, not separate. This arrangement is taken because transmission and reception are performed in a time division manner in the GSM. Separation of the ground plane for the ground terminals of these circuits is not required, if careful consideration is taken for only the output of the last-stage amplifier 11. The module can be made smaller than when this ground plane is separated.

A third embodiment of the RF circuit module for cellular phones for a Code Division Multiple Access (hereinafter referred to as "CDMA") system, to which the present invention is applied, is discussed, using FIGS. 13 and 14. The module of the third embodiment has a glass epoxy multilayer substrate comprising three dielectric layers and four conductor layers 100, 200, 300, 400, which is the same as the first embodiment, but its circuit arrangement differs in many respects from the first embodiment.

Figure 13:
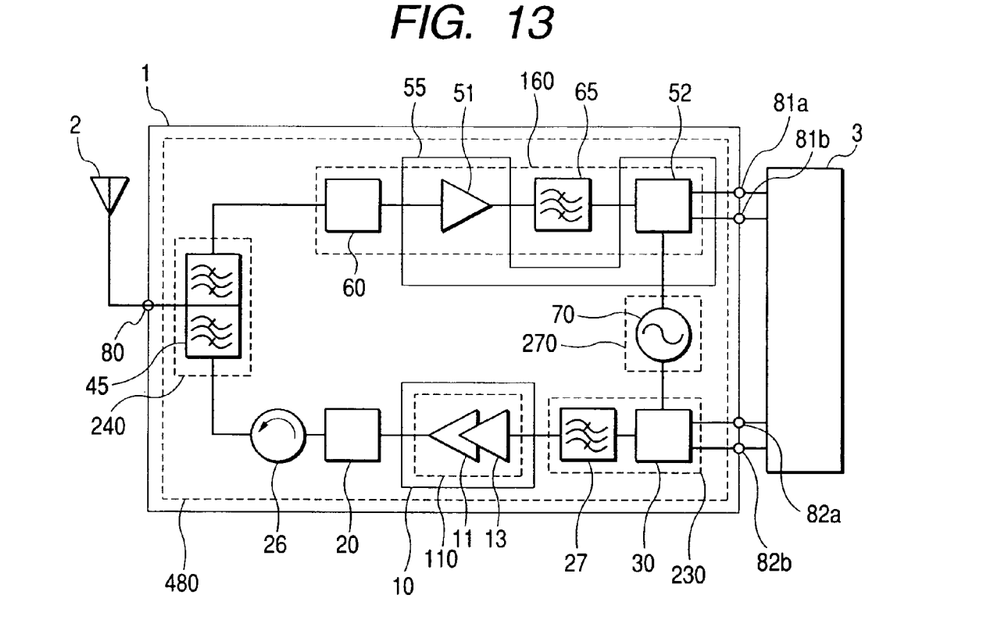
FIG. 13 is a circuit block diagram for explaining a third embodiment of the present invention.

In FIG. 13, the module 1, in the transmission chain, is configured with the transmitter 30 which converts the frequency of a transmit signal input through the input terminals 82a, 82b from the external BB-LSI 3 into a transmitting frequency, a transmitting BPF 27 which removes unwanted signal components included in an RF transmit signal output from the transmitter 30, the PA 10 which amplifies the power level of the RF transmit signal output from the transmitting BPF 27, and an isolator 26 to which the RF transmit signal output from the PA 10 is input via the output matching network 20 and which gives directionality to the RF transmit signal. In addition, the module 1 has a duplexer 45 which connects to the external antenna 2 via the antenna terminal 80 and which allows the RF transmit signal from the isolator 26 to go to the antenna 2 during transmission and allows an RF receive signal from the antenna 2, input to it via the antenna terminal 80, to go to the reception chain during reception. The duplexer 45 is an antenna duplex circuit. Furthermore, the module 1, in the reception chain, is configured with the LNA 51 to which the RF receive signal from the duplexer 45 is input via the receiving matching network 60 and which amplifies the signal level, the receiving BPF 65 which removes unwanted signal components included in the RF receive signal output from the LNA 51, and the receiver 52 which converts the frequency of the RF receive signal output from the receiving BPF 65 into the frequency of a receive signal and supplies the receive signal to the BB-LSI 3 through output terminals 81a, 81b. In the above module structure, a receiving RF-IC 55 is configured on which the LNA 41 and the receiver 52 are integrated. The PA 10 is a two-stage power amplifier consisting of the last-stage amplifier 11 and the first-stage amplifier 13 which are integrated in an IC chip structure. The transmitter 30 components are also integrated in an IC chip structure. The output matching network 20 is a circuit to match the output impedance of the PA 10 and the input impedance of the isolator 26 and the receiving matching network 60 is a circuit to match the impedances between the duplexer 45 and the LNA 51. The above circuits and chips are mounted on the substrate of the module 1. In the third embodiment, the receiving matching network 60, LNA 51, receiving BPF 65, and receiver 52 constitute the chain of the receive circuits 17. The transmitter 30 and the VCO 70 together with the receive circuits constitute the transceiver 9.

Here, the transmit signal which is output from the BB-LSI 13 and the receive signal which is input to the BB-LSI 13 are in a frequency band of about 3.8 MHz, the RF transmit signal which is output from the transmitter 30 has a frequency in the vicinity of 1.9 GHz, and the RF receive signal which is input to the receiver 52 has a frequency in the vicinity of about 2.1 GHz. The above frequencies are exemplary and the present invention is not limited to these frequencies.

In the third embodiment, the constituent circuits are grounded to separate ground planes provided for each and eventually grounded to the common ground plane 480. The separate ground planes are the transmitter ground plane 230 for the transmitter 30 and the transmitting BPF 27, the PA ground plane 110 for the PA 10, the antenna duplex circuit ground plane 240 for the duplexer 45, a receive circuits ground plane 160 for the receiving matching network 60, LNA 51, receiving BPF 65, and receiver 52, and the VCO ground plane 270 for the VCO 70. These separate ground planes are electrically isolated from each other as they are and function as the ground only by termination to the common ground plane 480.

Figure 14:
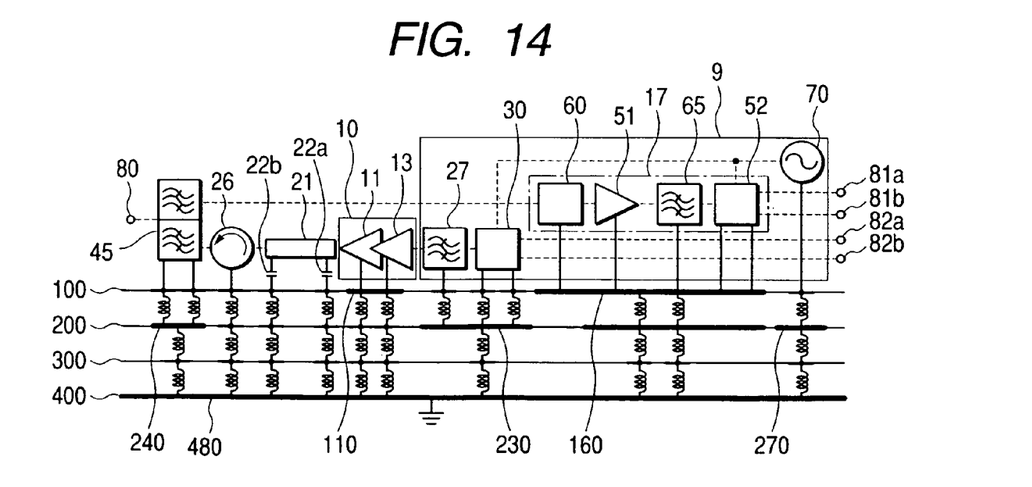
FIG. 14 is a diagram depicting connections to ground planes for explaining the third embodiment of the present invention.

FIG. 14 depicts the ground connections. The substrate of the module 1 is a layered composite consisting of three dielectric substrates; from the top, the first conductor layer 100, second conductor layer 200, third conductor layer 300, and fourth conductor layer 400 are formed in order. The circuits in the present RF circuit module are associated with the isolated ground planes as follows.

First, the ground terminals of the last-stage amplifier 11 and first-stage amplifier 13 are connected to the PA ground plane 110 located on the first conductor layer. The PA ground plane 110 is connected to the common ground plane 480 present on the fourth conductor layer 400 through 1st-2nd interlayer via-holes, 2nd-3rd interlayer via-holes, and 3rd-4th interlayer via-holes. The ground plane for the transmission line 21 which is the main element of the output matching network 20 is the common ground plane 480 and the ground terminals of the capacitors 22a and 22b which are also elements of the output matching network 20 are connected to the common ground plane 480 through 1st-2nd interlayer via-holes, 2nd-3rd interlayer via-holes, and 3rd-4th interlayer via-holes. Likewise, the ground terminal of the isolator 26 is connected to the common ground plane 480.

The ground terminals of the duplexer 45 are connected to the antenna duplex circuit ground plane 240 located on the second conductor layer 200 through 1st-2nd interlayer via-holes and the antenna duplex circuit ground plane 240 is connected to the common ground plane 480 a 2nd-3rd interlayer via-hole and 3rd-4th interlayer via-hole.

Then, the ground terminals of the transmitter 30 and transmitting BPF 27 are connected to the transmitter ground plane 230 located on the second conductor layer through 1st-2nd interlayer via-holes. The ground terminal of the VCO 70 is connected to the VCO ground plane 270 located on the second conductor layer through a 1st-2nd interlayer via-hole. The transmitter ground plane 230 and the VCO ground plane 270 are connected to the common ground plane 480 through 2nd-3rd interlayer via-holes and 3rd-4th interlayer via-holes.

Finally, the ground terminals of the receiving matching network 60, LNA 51, receiving BPF 65, and receiver 52 are connected to the receive circuits ground plane 160 by bonding wires or solder bumping and the receive circuits ground plane 160 is connected to the common ground plane 480 through 1st-2nd interlayer via-holes, 2nd-3rd interlayer via-holes, and 3rd-4th interlayer via-holes.

In the third embodiment, the PA ground plane 110, transmitter ground plane 230, receive circuits ground plane 160, VCO ground plane 270, antenna duplex circuit ground plane 240, and output matching network ground plane, or broadly, the common ground plane 480 are isolated, and, therefore, the third embodiment produces the same effects as in the first embodiment. Furthermore, since the CDMA system is a Frequency Division Duplex (FDD) communication system where the transmitter and the receive circuits operate simultaneously, signal interference from the transmitter to the receive circuits, if present, results in a great decrease in the receiving performance. However, the module in the third embodiment is able to effectively prevent the decrease in the receiving performance by isolating the PA ground plane 110, output matching network ground plane, or broadly, the common ground plane 480, transmitter ground plane 230, and antenna duplex circuit ground plane 240, across which signals will flow during transmission, from the receive circuits ground plane 160.

According to the present invention, in the RF circuit module in which the whole RF circuit block, namely, the power amplifier and the transceiver of wireless communication equipment is configured in a single module, RF signal isolation and thermal isolation can be provided only in the most proper places and, thus, the module can be downsized, while the component circuits still have high performances.

It is further understood by those skilled in the art that the foregoing description is a preferred embodiment of the disclosed device and that various changes and modifications may be made in the invention without departing from the spirit and scope thereof.

What is claimed is:

1. A radio frequency circuit module comprising:
   a module substrate;
   a first circuit to which a first signal is input and which outputs a second signal with a higher frequency than the first signal, and to which a third signal that differs from the first and second signals is input and which outputs a fourth signal with a lower frequency than the third signal;
   a second circuit which amplifies a power level of the second signal;
   a first ground plane for said first circuit;
   a second ground plane for said second circuit electrically isolated from said first ground plane mutually; and
   a common ground plane for said first and second circuit, included in said module substrate,
   wherein said first circuit and said second circuit are mounted on a top face of said module substrate,
   wherein said first and second ground planes are located on conductor layers of said module substrate,
   wherein said common ground plane is located on another conductor layer that is closer to a reverse side of said module substrate than the conductor layers on which said first and second ground planes are located and said first and second ground planes are electrically connected to said common ground plane,
   wherein said first circuit includes a fourth circuit to which the third signal is input and which outputs the fourth signal,
   wherein said second circuit comprises a power amplifier, and
   wherein said radio frequency circuit module further comprises:
   a third ground plane, electrically isolated from said first ground plane;
   a fourth ground plane;
   an antenna duplex circuit which allows the second signal to go to an external antenna and allows the third signal from said antenna to go to said fourth circuit; and
   an output matching network for impedance matching between said antenna duplex circuit and a last-stage amplifier of said amplifier,
   wherein a ground terminal of said last-stage amplifier is connected to said second ground plane, the ground terminals of said antenna duplex circuit are connected to said third ground plane, and the ground terminals of said output matching network are connected to said fourth ground plane, and
   wherein said fourth ground plane is electrically isolated in radio frequency from at least one of said first through third ground planes.

2. The radio frequency circuit module according to claim 1, wherein said output matching network comprises a transmission line and a plurality of capacitors grounded to said fourth ground plane.

3. The radio frequency circuit module according to claim 2, wherein said fourth ground plane is present on a conductor layer that is lower than the at least one ground plane that is electrically isolated in radio frequency from said fourth ground plane among said first through third ground planes.

4. The radio frequency circuit module according to claim 3, wherein said fourth ground plane is the common ground plane.

5. The radio frequency circuit module according to claim 1, further comprising:
   intermediate ground planes between said second, third, and fourth ground planes and said common ground plane, said second, third, and fourth ground planes being connected to said common ground plane via said intermediate ground planes.

* * * * *